(12) United States Patent
Michal

(10) Patent No.: US 9,793,181 B2
(45) Date of Patent: Oct. 17, 2017

(54) RESISTOR CALIBRATION USING A MOS CAPACITOR

(71) Applicant: STMicroelectronics (Grenoble 2) SAS, Grenoble (FR)

(72) Inventor: Vratislav Michal, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 123 days.

(21) Appl. No.: 14/659,051

(22) Filed: Mar. 16, 2015

(65) Prior Publication Data
US 2016/0276070 A1    Sep. 22, 2016

(51) Int. Cl.
H01C 10/50    (2006.01)
H01L 21/66    (2006.01)
H01C 17/22    (2006.01)
H01C 17/26    (2006.01)

(52) U.S. Cl.
CPC ............. *H01L 22/14* (2013.01); *H01C 17/22* (2013.01); *H01C 17/26* (2013.01)

(58) Field of Classification Search
CPC ........... H01C 10/16; H01C 10/50; H01C 1/00
See application file for complete search history.

(56) References Cited

U.S. PATENT DOCUMENTS

| | | | | |
|---|---|---|---|---|
| 6,577,250 B1* | 6/2003 | Yee | ......................... | H03M 11/24 341/26 |
| 7,113,028 B2* | 9/2006 | Kimppa | ............. | H03H 11/1291 327/552 |
| 7,848,725 B2* | 12/2010 | Zolfaghari | ............ | H03L 7/0891 455/260 |
| 7,952,382 B2* | 5/2011 | Moon | ..................... | G11C 5/063 326/30 |
| 8,773,161 B2* | 7/2014 | Moon | ..................... | G11C 5/063 326/101 |
| 2007/0014329 A1* | 1/2007 | Sinha | ..................... | G01K 7/015 374/185 |
| 2008/0024160 A1* | 1/2008 | Ou-yang | ............ | H03K 19/0005 326/30 |
| 2010/0007375 A1* | 1/2010 | Lee | ..................... | H04L 25/0298 326/30 |
| 2011/0163778 A1* | 7/2011 | Moon | ..................... | G11C 5/063 326/30 |
| 2012/0126849 A1* | 5/2012 | Gillingham | ........ | H03K 19/0005 326/30 |

* cited by examiner

*Primary Examiner* — Kyung Lee
(74) *Attorney, Agent, or Firm* — Seed IP Law Group LLP

(57) ABSTRACT

A method for calibrating a resistance value comprises the steps of measuring a value of a reference capacitor, and adjusting a variable resistor based on the measured value of the reference capacitor. The method may more specifically comprise the steps of directing a constant current through the reference capacitor during a reference time interval; after the reference time interval, directing the constant current through the variable resistor; and varying the variable resistor value progressively by varying a control signal until a voltage of the variable resistor reaches a voltage of the reference capacitor.

22 Claims, 1 Drawing Sheet

RESISTOR CALIBRATION USING A MOS CAPACITOR

BACKGROUND

Technical Field

The present disclosure relates to the realization of accurate resistors in integrated circuits.

Description of the Related Art

Certain integrated circuit devices require accurate resistors to perform their functions. In current integrated circuit manufacturing technologies, resistors may be fabricated as polysilicon tracks whose width and length are specified by design to achieve the desired resistance value. The resistance value is however temperature and process dependent, and may be subject to a typical dispersion of approximately ±15% relative to the specified value. When a better accuracy is needed, the resistors are generally adjusted individually during post-fabrication trimming operations, which increases the manufacturing cost.

BRIEF SUMMARY

A method is provided in the present disclosure for calibrating a resistance value comprising the steps of measuring a value of a reference capacitor, and adjusting a variable resistor based on the measured value of the reference capacitor.

The method may comprise more specifically the steps of:

directing a constant current through the reference capacitor during a reference time interval;

after the reference time interval, directing the constant current through the variable resistor; and varying the variable resistor value progressively by varying a control signal until a voltage of the variable resistor reaches a voltage of the reference capacitor.

A circuit is also provided in the present disclosure for calibrating a resistance value, comprising:

a reference capacitor;

a variable resistor; and control circuitry configured to measure the value of the reference capacitor and accordingly adjust the variable resistor.

The circuit may more specifically comprise:

a constant current source;

a switch configured to direct the constant current through the reference capacitor in a first position and to direct the constant current through the variable resistor in a second position; and a control circuit configured to:

set the switch in the first position during a reference time interval, set the switch in the second position, and control the variable resistor through a progressively varying control signal until a voltage of the variable resistor reaches a voltage of the reference capacitor.

DETAILED DESCRIPTION

In integrated circuits, certain types of capacitors can be manufactured with significantly better accuracy than resistors. This is the case of MOS capacitors, for instance. A MOS capacitor is formed by the conductive elements on either side of the gate oxide of a MOS transistor, i.e. the gate metallization on one side, and the channel, source and drain regions on the opposite side. The value of a MOS capacitor is subject to a typical dispersion as low as ±2% with respect to a value specified by design, mainly thanks to the accuracy of the oxide layer thickness. Indeed, the gate oxide thickness has a significant influence on transistor characteristics, which is why integrated circuit manufacturing processes are designed to offer accurate control over the oxide thickness.

It is proposed in the present disclosure to auto-calibrate a variable resistor using the value of a capacitor as a reference, especially a MOS capacitor. As a consequence, an accuracy close to that of a MOS capacitor may be obtained for the variable resistor after the calibration procedure. The auto-calibration procedure may take place each time the integrated circuit is powered on, or on a regular basis for an integrated circuit that may undergo significant temperature variations during operation.

Figure 1:
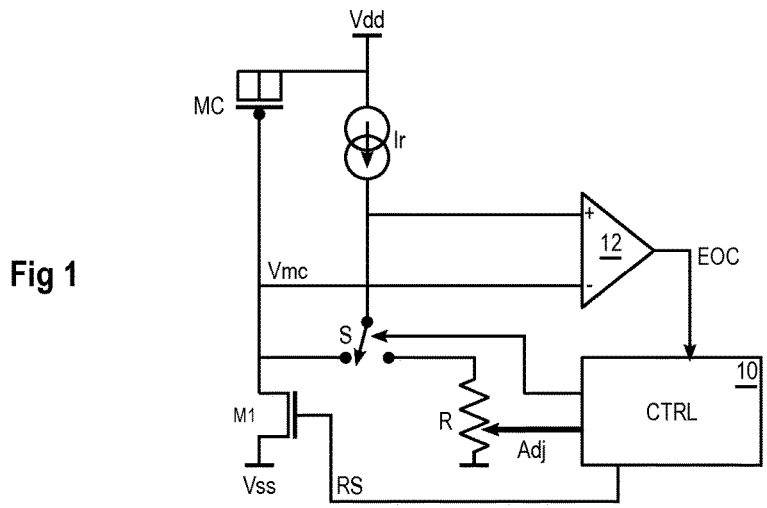
FIG. 1 is a schematic diagram of an embodiment of a resistor calibration circuit according to the invention.

FIG. 1 is a schematic diagram of an embodiment of a resistor calibration circuit. It includes a programmable resistor R connected to a ground line Vss. The value of resistor R may be adjusted by a control signal Adj provided by a control circuit 10. A reference MOS capacitor MC is shown in the form of a P-MOS transistor having its source, drain and bulk terminals connected to a stabilized positive power supply line Vdd. The gate of transistor MC is connected to the ground line Vss through a switch in the form of an N-MOS transistor M1. A purpose of transistor M1 is to charge the capacitor MC to voltage Vdd. The gate of the transistor M1 is controlled by a reset signal RS issued by circuit 10.

A P-MOS transistor connected to line Vdd, as shown, will operate during the calibration phase with a large gate-source voltage, in a region offering a capacitance that is constant and independent of the gate-source voltage variations. If an N-MOS transistor connected to line Vss is used instead, it may come to operate under low gate-source voltages that can cause a capacitance variation.

A constant current source Ir is connected between the line Vdd and a switch S. The switch S, controlled by circuit 10, is configured to direct the current Ir through capacitor MC in a first position, and to direct the current Ir through resistor R in a second position.

A comparator 12 is connected to activate an end-of-calibration signal EOC when the voltage across the resistor R reaches the voltage at the node between the capacitor MC and the transistor M1.

Figure 2:
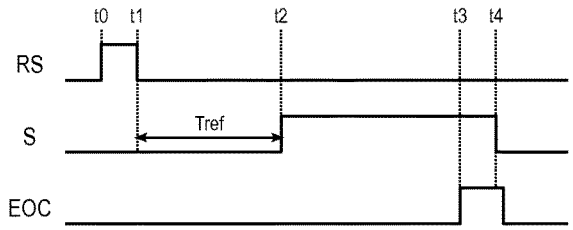
FIG. 2 is a time diagram illustrating an exemplary operation of the calibration circuit of FIG. 1.

FIG. 2 is a time diagram illustrating an exemplary operation of the circuit of FIG. 1. It shows the reset signal RS controlling the switch M1, the signal S controlling the switch S, the end-of-calibration signal EOC, the voltage Vr across the resistor R, the voltage Vmc at the node between the capacitor MC and switch M1, and the values of the resistor adjustment signal Adj.

Initially, outside a calibration phase, both signals R and S are low, whereby switch M1 is open and switch S couples the current source Ir to capacitor MC. The voltage Vmc is pulled to a level slightly below Vdd, corresponding to the voltage drop across current source Ir. The current source Ir is in a low consumption mode because it cannot deliver its current. The voltage Vr across the resistor R is zero.

At a time t0, a calibration phase is initiated. The signal RS goes high during a clock cycle, up to a time t1, resetting the capacitor MC by bringing voltage Vmc to 0.

From time t1, the voltage Vmc increases linearly according to the relation Vmc=Ir·t/Cmc, where Cmc is the value of capacitor MC and t is time.

A time t2 occurs a reference interval Tref after time t1. At time t2, the signal S goes high, setting switch S in its second position, where the current source Ir biases the resistor R. The capacitor MC is in a floating mode and maintains the voltage Vmc reached at time t2. This voltage is equal to:

$$Vmc = \frac{Ir}{Cmc} Tref \qquad (1)$$

The resistor control signal Adj may be at a level selecting the lowest value of resistor R. The signal Adj may be digital, for example a 4-bit signal, as shown. The lowest value of resistor R in its adjustment range may then be selected by Adj=0000. The voltage Vr exhibits a step equal to Ir·R (0000), where R(0000) is the value of resistor R for Adj=0000.

From time t2, the control circuit 10 progressively increases the value of resistor R, for instance by incrementing the binary value Adj in consecutive clock cycles, as shown, causing a stepwise increase of the voltage Vr.

At a time t3, the voltage Vr rises above the voltage Vmc. This event is detected by comparator 12, causing signal EOC to go high. The calibration procedure is ended by the control circuit 10 and the value reached by the control signal Adj (0101) is stored.

At a time t4, signal S goes low, placing switch S back in its first position. The current source Ir is connected again to the capacitor MC—the voltage Vmc resumes its linear rise up to a value close to Vdd, eventually crossing the voltage Vr and causing signal EOC to go low again. The resistor R is in a floating mode and may be connected to circuitry that requires it. The stored value of signal Adj is applied to resistor R, which thus maintains the resistance value reached at time t3 throughout the operation phase of the integrated circuit, or until a next calibration phase.

The value of voltage Vr achieved at time t3 is expressed by $$Vr=Ir \cdot R(Adj)$$

This value is also substantially equal to the value of voltage Vmc reached at time t2, expressed by equation (1), whereby $$Ir \cdot R(\text{Adj}) = \frac{Tref}{Cmc} Ir$$

The current Ir disappears from this equation, yielding $$R(\text{Adj}) = \frac{Tref}{Cmc}$$

The calibration circuit thus produces a resistance value depending only on a time (Tref) and a MOS capacitor value (Cmc). The time Tref may be specified in clock periods of a time base and have an accuracy of a few ppms. The value Cmc, of a MOS capacitor, may be specified by design and achieve a typical accuracy of ±2%. Therefore the desired resistance value R(Adj) may achieve an accuracy close to ±2% provided the adjustment steps are within the ±2% range.

Figure 3:
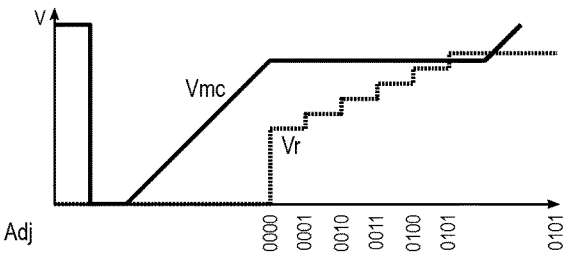
FIG. 3 is a circuit diagram of an embodiment of an adjustable resistor usable in the circuit of FIG. 1.
Figure 3:
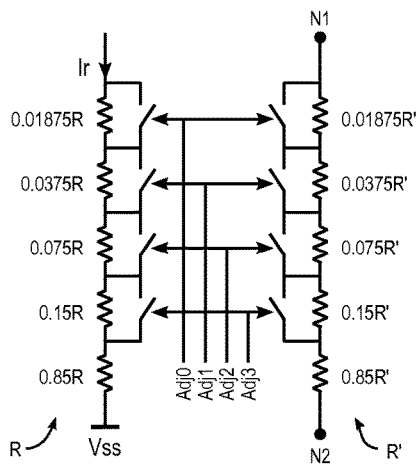

FIG. 3 is a schematic diagram of a first embodiment of a pair of matched digitally controlled resistors. The variable resistor R, usable in the circuit of FIG. 1, is shown on the left side of the figure. It is configured, as an example, to be adjustable between 0.85R and 1.13125R, where R is the value specified by design, which may differ from the value actually achieved. The value of the resistor may be varied in fifteen steps of 0.01825R, selected by a 4-bit adjustment signal Adj.

More specifically, the variable resistor R comprises five fixed-value resistors connected in series. A first one, connected to line Vss, is specified to value 0.85R. The second to fifth resistors are specified to values in geometric progression, respectively 0.15R, 0.075R, 0.0375R, and 0.01875R. Each of the second to fifth resistors has a respective switch connected across it, controlled by a corresponding bit of the adjustment signal Adj, wherein the least significant bits control the switches assigned to the lower value resistors.

A variable resistor R as shown on the left side of FIG. 3 will usually be specified to a value compatible with the calibration device, i.e. with the values chosen for the constant current Ir and the reference interval Tref. Such a value may not be adapted to all situations, for instance, when lower or higher resistance values are desired. Moreover, many applications may require multiple accurate resistors, in which case it may be inconvenient to provide a calibration circuit for each resistor.

FIG. 3 shows an approach that may be used for calibrating multiple resistors with a single calibration circuit. The resistors may moreover have any specified value. This approach is based on the fact that resistors fabricated on a same die are usually matched, i.e. although the absolute values of the resistors may be subject to significant dispersion, the ratios of the resistor values remain unchanged.

The variable resistor R on the left of FIG. 3 may be used in the calibration circuit to find and store the correct value of the adjustment signal Adj. The stored adjustment value is then used to control in parallel multiple variable resistors having the same structure, such as a variable resistor R' shown on the right, specified to a value R'. The variable resistor R', not used during the calibration phase like resistor R, may be permanently connected between any two nodes N1, N2 of a circuit.

In practice, the switches connected across the fixed resistors have a certain on-resistance. When connected in series like in FIG. 3, the sum of the on-resistances of the switches may be non-negligible with respect to the specified value R', especially if the specified value R' is low and the adjustment step is chosen small by increasing the resolution of signal Adj together with the number of fixed resistors in series.

Figure 4:
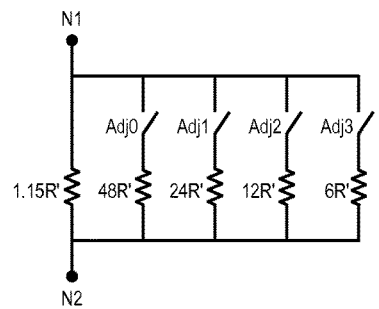
FIG. 4 is a circuit diagram of another embodiment of an adjustable resistor usable in the circuit of FIG. 1.

FIG. 4 is a schematic diagram of an embodiment of a digitally controlled resistor R' that may be used when the on-resistance of the switches becomes non-negligible. The variable resistor comprises five fixed-value resistors connected in parallel, in this example. A first one, connected between nodes N1, N2, is specified to a value 1.15R'. The second to fifth resistors are specified to values in geometric progression, respectively 48R', 24R', 12R', and 6R'. Each of the second to fifth resistors has a respective switch connected in series, controlled by a corresponding bit of the adjustment signal Adj, wherein the least significant bits control the switches assigned to the higher value resistors.

With this configuration, the stepwise increments are not equal, causing a non-linear progression of the resulting resistor value with respect to the control signal Adj. This has no consequence, provided all the variable resistors controlled by the calibration circuit have the same structure, and the largest step is smaller than the desired accuracy.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

For instance, during the calibration phase, the variable resistor may be controlled so that its value progressively decreases instead of being increased.

The invention claimed is:

1. A method for calibrating a resistance value, comprising:
measuring a value of a reference capacitor; and
adjusting a first variable resistor based on the measured value of the reference capacitor;
directing a constant current through the reference capacitor during a reference time interval;
after the reference time interval, directing the constant current through the first variable resistor; and
varying the first variable resistor value progressively by varying a control signal until a voltage of the first variable resistor reaches a voltage of the reference capacitor.

2. The method of claim 1, comprising:
providing a second variable resistor having a structure matching the structure of the first variable resistor; and
setting the second variable resistor through the control signal.

3. The method of claim 1, wherein the variable resistor is adjustable stepwise through a digital control signal, and the method comprises progressively incrementing or decrementing the digital control signal.

4. The method of claim 1, comprising fabricating the reference capacitor as a MOS capacitor.

5. The method of claim 1, comprising resetting the reference capacitor before the reference time interval.

6. A circuit for calibrating a resistance value, comprising:
a reference capacitor;
a first variable resistor; and
control circuitry configured to measure a value of the reference capacitor and adjust the first variable resistor based on the measured value of the reference capacitor, wherein the control circuitry includes:
a constant current source configured to produce a constant current;
a switch configured to connect the constant current source across the reference capacitor in a first position and to direct the constant current through the first variable resistor in a second position; and
a control circuit configured to:
set the switch in the first position during a reference time interval,
set the switch in the second position, and
control the first variable resistor through a progressively varying control signal until a voltage of the first variable resistor reaches a voltage of the reference capacitor.

7. The circuit of claim 6, comprising:
a second variable resistor having a structure matching a structure of the first variable resistor, the second variable resistor being configured to be set by the control signal.

8. The circuit of claim 6, wherein the control signal is digital and the variable resistor comprises:
a plurality of fixed resistors connected in series, having values in geometric progression; and
a plurality of switches respectively connected in parallel with the fixed resistors, the control circuit being configured to control each switch by a respective bit of the control signal.

9. The circuit of claim 6, wherein the control signal is digital and the variable resistor comprises:
a first fixed resistor;
a plurality of second fixed resistors having values in geometric progression; and
a plurality of switches respectively connected in series with the second fixed resistors, each switch being configured to selectively connect a corresponding one of the second fixed resistors in parallel with the first fixed resistor, the control circuit being configured to control each switch by a respective bit of the control signal.

10. The circuit of claim 6, wherein the reference capacitor is a MOS capacitor in the form of a P-MOS transistor.

11. The circuit of claim 6, wherein the control circuit is configured to reset the reference capacitor before the reference time interval.

12. A circuit for calibrating a resistance value, comprising:
a reference capacitor;
a first variable resistor; and
control circuitry configured to measure a value of the reference capacitor and adjust the first variable resistor based on the measured value of the reference capacitor, wherein the control circuitry includes:
a current source coupled to the first variable resistor configured to produce a current through the first variable resistor;
a voltage comparator configured to compare a voltage of the reference capacitor with a voltage across the first variable resistor and to output a calibration signal indicating that the voltage across the first variable resistor has reached the voltage across the reference capacitor; and
a control circuit coupled to the voltage comparator and the first variable resistor and configured to increase a resistance value of the first variable resistor until the calibration signal indicates that the voltage across the first variable resistor has reached the voltage across the reference capacitor.

13. The circuit of claim 12, wherein the reference capacitor is a P-MOS transistor having source and drain terminals connected to each other and to a voltage source terminal and a gate terminal electrically coupled to an input of the voltage comparator.

14. A calibration circuit for calibrating a resistance value, comprising:
a reference capacitor;

a voltage detector coupled to the reference capacitor and configured to detect a voltage of the reference capacitor;

a first variable resistor; and a control circuit coupled to the voltage detector and configured to adjust a resistance value of the first variable resistor based on the voltage of the reference capacitor detected by the voltage detector, wherein:

the voltage detector includes a voltage comparator configured to compare a voltage across the reference comparator with a voltage across the first variable resistor and to output a calibration signal indicating that the voltage across the first variable resistor has reached the voltage across the reference capacitor; and the control circuit is coupled to the voltage comparator and the first variable resistor and is configured to increase a resistance value of the first variable resistor until the calibration signal indicates that the voltage across the first variable resistor has reached the voltage across the reference capacitor.

15. The calibration circuit of claim 14, further comprising:

a constant current source configured to produce a constant current; and a switch configured to connect the constant current source across the reference capacitor in a first position and to direct the constant current through the first variable resistor in a second position, wherein the control circuit is configured to:

set the switch in the first position during a reference time interval, set the switch in the second position, and while the switch is in the second position, control the first variable resistor through a progressively varying control signal until the voltage of the first variable resistor reaches the voltage of the reference capacitor; and set the switch back to the first position in response to the calibration signal indicating that the voltage across the first variable resistor has reached the voltage across the reference capacitor.

16. The calibration circuit of claim 15, further comprising a reset transistor coupled to the reference capacitor, wherein the control circuit is configured to cause the reset transistor to discharge the reference capacitor before the reference time interval.

17. A calibration circuit for calibrating a resistance value, comprising:

a reference capacitor;

a voltage detector coupled to the reference capacitor and configured to detect a voltage of the reference capacitor;

a first variable resistor;

a control circuit coupled to the voltage detector and configured to adjust a resistance value of the first variable resistor based on the voltage of the reference capacitor detected by the voltage detector, wherein the control circuit is configured to control the first variable resistor through a progressively varying control signal until the voltage of the first variable resistor reaches the voltage of the reference capacitor; and a second variable resistor having a structure matching a structure of the first variable resistor, the second variable resistor being configured to be set by the control signal.

18. The calibration circuit of claim 17, wherein the reference capacitor is a P-MOS transistor having source and drain terminals connected to each other and to a voltage source terminal and a gate terminal electrically coupled to an input of the voltage detector.

19. A calibration for calibrating a resistance value, comprising:

a reference capacitor;

a voltage detector coupled to the reference capacitor and configured to detect a voltage of the reference capacitor;

a first variable resistor; and a control circuit coupled to the voltage detector and configured to adjust a resistance value of the first variable resistor based on the voltage of the reference capacitor detected by the voltage detector, wherein the control signal is digital and the variable resistor comprises:

a plurality of fixed resistors connected in series, having values in geometric progression; and a plurality of switches respectively connected in parallel with the fixed resistors, the control circuit being configured to control each switch by a respective bit of the control signal.

20. The calibration circuit of claim 19, wherein the reference capacitor is a P-MOS transistor having source and drain terminals connected to each other and to a voltage source terminal and a gate terminal electrically coupled to an input of the voltage detector.

21. A calibration circuit for calibrating a resistance value, comprising:

a reference capacitor;

a voltage detector coupled to the reference capacitor and configured to detect a voltage of the reference capacitor;

a first variable resistor; and a control circuit coupled to the voltage detector and configured to adjust a resistance value of the first variable resistor based on the voltage of the reference capacitor detected by the voltage detector, wherein the reference capacitor is a P-MOS transistor having source and drain terminals connected to each other and to a voltage source terminal and a gate terminal electrically coupled to an input of the voltage detector.

22. The calibration circuit of claim 21, further comprising a reset transistor coupled to the reference capacitor, wherein the control circuit is configured to cause the reset transistor to discharge the reference capacitor before the reference time interval.

* * * * *